United States Patent
Coolbaugh et al.

(10) Patent No.: US 6,255,185 B1
(45) Date of Patent: Jul. 3, 2001

(54) TWO STEP ANNEAL FOR CONTROLLING RESISTOR TOLERANCE

(75) Inventors: Douglas Duane Coolbaugh; Glenn Robert Miller, both of Essex Junction; Sophia Maumovna Ratenberg, Williston, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/314,513

(22) Filed: May 19, 1999

(51) Int. Cl.[7] .................................................. H01L 21/20
(52) U.S. Cl. ...................... 438/382; 438/381; 438/584; 438/796
(58) Field of Search ...................... 438/382, 381, 438/522, 584, 795, 796

(56) References Cited

U.S. PATENT DOCUMENTS

| | | |
|---|---|---|
| 4,229,502 | 10/1980 | Wu et al. . |
| 4,394,191 | 7/1983 | Wada et al. . |
| 4,467,519 | 8/1984 | Glang et al. . |
| 4,707,909 | * 11/1987 | Blanchard . |
| 4,762,801 | 8/1988 | Kapoor . |
| 5,308,789 | 5/1994 | Yoshimura et al. . |

* cited by examiner

*Primary Examiner*—Kevin M. Picardat
*Assistant Examiner*—D. M. Collins
(74) *Attorney, Agent, or Firm*—Scully, Scott, Murphy & Presser; William D. Sabo

(57) ABSTRACT

A method of controlling the resistance and improving the low temperature tolerance of a polysilicon resistor is provided. The method of the present invention employs a second annealing step after one of the high temperature (about 800° C. or above) device activation anneals. That is, the second annealing step can be used after source/drain activation, emitter activation or silicide formation. In accordance with the present invention, if a low temperature second annealing step below about 800° C. is performed after the high temperature device activation anneal, the resistance of the resistor increases, whereas when the second annealing temperature is higher than about 800° C., the resistance of the resistor decreases.

17 Claims, 1 Drawing Sheet

TWO STEP ANNEAL FOR CONTROLLING RESISTOR TOLERANCE

FIELD OF THE INVENTION

The present invention relates to semiconductor processing, and in particular to a method of fabricating a polysilicon resistor wherein two different annealing steps are employed to control the resistance and/or tolerance of the resistor. The two different annealing steps may be performed any time during the manufacturing of the integrated circuit, i.e. during source/drain activation, bipolar emitter activation, silicide formation or growing a dielectric film. Specifically, it has been found that by applying a second anneal after a high temperature anneal, the resulting resistance of a polysilicon resistor can be set to a specified value and the resistor tolerance across wafer and from lot to lot can be improved significantly. Moreover, by adjusting the temperature of the second anneal, it is possible to vary the resistance of the polysilicon resistor.

BACKGROUND OF THE INVENTION

Semiconductor structures and integrated circuits are manufactured using a wide variety of well known techniques. In the manufacturing of semiconductor devices or integrated circuits, active/passive components are formed on a semiconducting substrate such as silicon, and then interconnected in a desired manner.

Resistors are typically formed in such structures using one of two well known techniques. In the first technique, regions of the semiconductor substrate are doped with n- or p-type dopants. This provides conductive regions in the substrate having a desired resistivity. By forming ohmic contacts to a pair of spaced-apart locations in such regions, a diffused region is provided. Such resistors are referred to in the art as diffused resistors.

In the second technique, an insulator layer, i.e. dielectric layer, is formed on the surface of a semiconductor substrate. Next, a layer of polysilicon is formed on the insulator layer. The polysilicon film is either doped in-situ or it is doped with a n- or p-type dopant after deposition of the same. Again, the dopants form a conductive region having a desired resistivity. To complete the resistor, ohmic connections are formed on a pair of spaced-apart regions on the polysilicon layer. These resistors are referred to in the art as polysilicon resistors.

Compared with diffused resistors, polysilicon resistors offer a significant advantage in that they do not consume any area in the semiconductor substrate itself. Thus, the substrate remains available for the fabrication of active components, while the resistor interconnections can be made directly above the active components themselves. Moreover, since the resistor is separated the semiconductor substrate by an insulating layer, the polysilicon resistors have a substantially lower capacitance with the substrate than their diffused counterparts.

One major drawback of such polysilicon resistors is that the polysilicon resistors are sensitive to low temperature variation in excess of about 500° to about 600° C. The exact temperature sensitivity depends on the dopant species found in the polysilicon layer as well as the composition, i.e. grain boundaries and grain size, of the polysilicon itself. Therefore, if the temperature of the back end of the line (BEOL) or later front end of the line (FEOL) process changes, the resistance of the polysilicon resistor will often vary to a value below the targeted resistance. For example, in the development of N+ type polysilicon resistors for BiCMOS, the resistance of the polysilicon resistor dropped by approximately 20% due to changes in the low temperature processing in the range described above.

In view of the above mentioned drawback with prior art polysilicon resistors, there is a continued need for developing new and improved methods which can substantially eliminate the variance in resistance caused by low temperature thermal processing that may occur during subsequent BEOL or FEOL processing. There is also a need for developing a processing method which is capable of providing a controllable resistance to a polysilicon resistor that has a high degree of tolerance for low BEOL and FEOL processing temperatures.

SUMMARY OF THE INVENTION

One object of the present invention is to provide a method of manufacturing a polysilicon resistor which substantially eliminates the variance in resistance caused by low temperature BEOL and FEOL processing.

Another object of the present invention is to develop a method which can be easily implemented after any high temperature (about 800° C. or higher) device activation anneal step typically used in manufacturing the integrated circuit.

It is noted that the temperature range for the high temperature device activation anneal employed in the present invention depends on the dopant type as well as the polysilicon composition. Thus, the lower temperature limit of the high temperature device activation anneal may fluctuate about ±20° C. The term "device activation" is used herein to denote any anneal whose function it is to provide an active region in and/or on an integrated circuit. That is, any anneal capable of forming activated source/drain diffusion regions in a semiconductor substrate, an anneal capable of forming an activated bipolar emitter region, or an anneal capable of forming a silicide or dielectric region on a structure.

A further object of the present invention is to provide a method which can render a predetermined resistance value to a polysilicon resistor which is either higher or lower that which can be obtained by merely employing the high temperature device activation anneal.

A still further object of the present invention is to provide a method which effects only the resistance value of the polysilicon resistor, while causing little or no changes to other parametrics of the integrated circuit.

These and other objects and advantages can be obtained in the present invention by employing a second anneal step which follows a high temperature device activation anneal step. The second annealing step can be carried out at a temperature lower than about 800° C. This embodiment causes deactivation of the dopants within the polysilicon layer and a subsequent increase in the resistance of the polysilicon resistor.

In another embodiment of the present invention, the second annealing step may be carried out at a temperature higher than about 800° C. In this embodiment of the present invention, the second annealing step causes activation of the dopant atoms within the polysilicon layer and a subsequent decrease in the resistance of the polysilicon resistor.

Specifically, the first embodiment of the present invention comprises the steps of:

(a) providing a polysilicon resistor structure, said polysilicon resistor structure comprising a semiconductor substrate, a dielectric layer formed on said semiconductor substrate, and a doped polysilicon layer formed on said dielectric layer;

(b) forming device regions on and/or in the structure provided in (a);

(c) conducting a high temperature device activation anneal on the structure provided in (b), said high temperature device activation anneal being carried out at a temperature of about 800° C. or above; and (d) conducting a second anneal, after said high temperature device activation anneal, at a temperature less than about 800° C. so as to cause an increase in resistance of said polysilicon resistor.

In the second embodiment described above, the inventive method comprises the steps of:

(a) providing a polysilicon resistor structure, said polysilicon resistor structure comprising a semiconductor substrate, a dielectric layer formed on said semiconductor substrate, and a doped polysilicon layer formed on said dielectric layer;

(b) forming device regions on and/or in the structure provided in (a);

(c) conducting a high temperature device activation anneal on said structure provided in (b), said high temperature device activation anneal being carried out at a temperature of about 800° C. or above; and (d) conducting a second annealing step, after said high temperature device activation anneal, at a temperature higher than about 800° C. so as to cause a decrease in resistance of said polysilicon resistor.

It is emphasized that applicants have determined that by adding a second annealing step after a high temperature device activation anneal, it is possible to control the resistance of the polysilicon resistor and to provide improved tolerance to the same against resistance variations caused by low temperature subsequent BEOL or FEOL processing. It also emphasized that the second annealing step may take place after any device activation step which requires a high temperature anneal to activate the same. Thus, the second annealing step may follow a high temperature anneal used for source/drain activation, bipolar emitter activation, growing a dielectric film or silicide formation. In the latter application, another conductive material such as Ti, W, Co and Ta is applied to the surface of the doped polysilicon layer. When Ti is employed as the other conductive material, the high temperature annealing causes the formation of a $TiSi_2$ layer at the interface between the polysilicon layer and Ti.

DETAILED DESCRIPTION OF THE INVENTION

Figure 1:
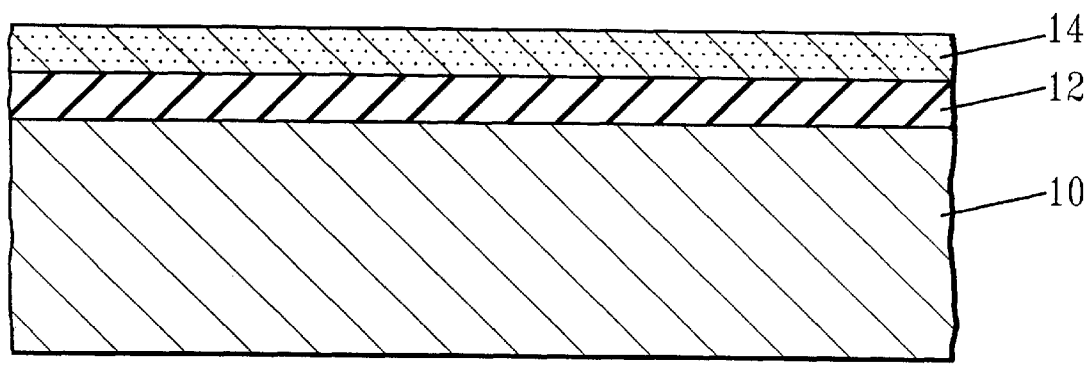
FIG. 1 is cross-sectional view of a fragment of a polysilicon resistor that can be used in the present invention.

The present invention, which provides an improved method of controlling the resistance of a polysilicon resistor as well as the tolerance of the same against variance in resistance caused by low temperature (500°–600° C.) BEOL or FEOL processing, will now be described in greater detail by referring to the drawings that accompany this application. It should be noted that in the accompanying drawings like elements or corresponding components are referred to by like reference numerals.

Reference is first made to FIG. 1 which shows a cross-sectional view of a basic polysilicon resistor that can be employed in the present invention. Specifically, the polysilicon resistor shown in FIG. 1 comprises a semiconductor substrate 10, a dielectric layer 12 and a polysilicon layer 14 that has been doped with a n- or p-type dopant.

Figure 2:
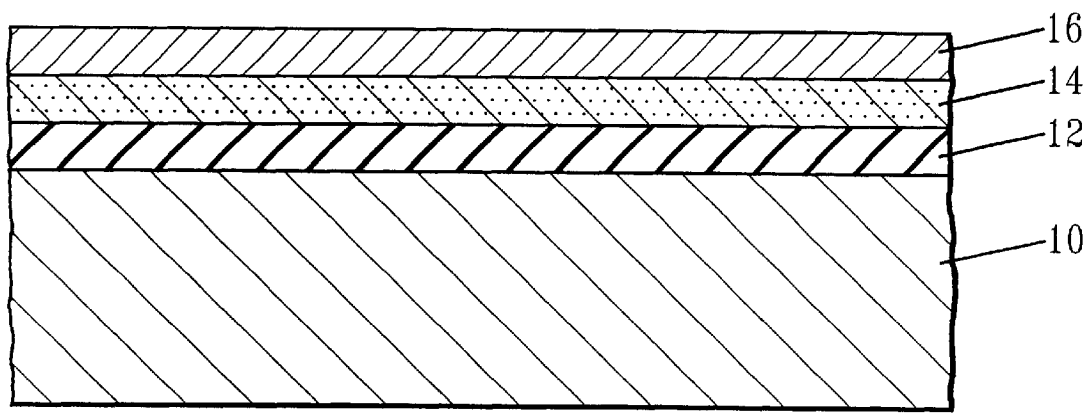
FIG. 2 is a cross-sectional view of another fragment of a polysilicon resistor that can be used in the present invention. This resistor differs from the resistor shown in FIG. 1 since it contains a conductive layer over the polysilicon layer.

FIG. 2 shows another basic polysilicon resistor that can be employed in the present invention. The polysilicon resistor shown in FIG. 2 comprises semiconductor substrate 10, dielectric layer 12, doped polysilicon layer 14 and a conductive layer 16 formed on the top of polysilicon layer 14.

These polysilicon resistors shown in FIGS. 1 and 2 represent basic examples of polysilicon resistors that can be employed in the present invention. Other polysilicon resistors containing at least a layer of doped polysilicon over a dielectric layer are also contemplated herein. The polysilicon resistors shown in FIGS. 1 and 2 are prepared using conventional materials and processes well known to those skilled in the art.

For example, semiconductor substrate 10 employed in the present invention is any semiconducting material including, but not limited to: Si, Ge, SiGe, SiCGe, Ga, GaAs, InAs, InP and all other III/V compounds. Of these semiconducting materials, it is highly preferred that semiconductor substrate 10 be composed of Si. The semiconductor substrate may be doped, undoped or contain doped and undoped regions therein. The semiconductor substrate may contain active device regions and/or device isolation regions embedded in the surface thereof. For clarity, such regions are not shown in FIGS. 1 and 2, but nevertheless the same could be present in region 10.

Dielectric layer 12 is composed of any material which is capable of acting as an insulator between semiconductor substrate 10 and doped polysilicon region 14. The present invention thus contemplates the use of inorganic as well as organic dielectric materials. Suitable dielectric materials for use as layer 12 include, but are not limited to: $SiO_2$, $Si_3N_4$, perovskite-type oxides such as barium strontium titanate, diamond, diamond-like carbon, polyimides, silicon-containing polymers, paralene polymers and other like dielectric materials. Of the dielectric materials mentioned above, it is highly preferred that dielectric layer 12 be composed of $SiO_2$ or $Si_3N_4$.

When present, conductive layer 16 is composed of any conductive material which is capable of forming a silicide layer upon heating at a temperature in excess of 800° C. Suitable conductive materials that are capable of forming a silicide upon high temperature heating include, but are not limited to: Ti, Ta, Co, W and other like conductive materials. Highly preferred conductive materials that can be employed as layer 16 are Ti and W.

As mentioned above, the structures shown in FIGS. 1 and 2 are fabricated using processing techniques that are well known to those skilled in the art. For instance, dielectric layer is first formed on the surface of semiconductor substrate by either growing the dielectric layer using conventional thermal growing processes or by depositing the dielectric layer using conventional deposition techniques such as chemical vapor deposition (CVD), plasma-assisted chemical vapor deposition, spin-on coating, dip coating and other deposition processes well known to those skilled in the art. While not critical to the present invention, the final thickness of the dielectric layer is from about 100 to about 3000 Å. If needed, the structure containing semiconductor substrate 10 and dielectric layer 12 can be planarized using conventional planarization techniques well known to those skilled in the art such as chemical-mechanical polishing (CMP) or grinding.

Next a polysilicon layer is formed on the surface of dielectric layer 12 using conventional deposition techniques well known to those skilled in the art. For example, chemical vapor deposition, plasma-assisted chemical vapor deposition or sputtering may be used to form the polysilicon layer on the surface of dielectric layer 12. A highly preferred means for depositing the polysilicon layer is by the pyrolysis of a silane at low temperatures such as between 600° to 750° C. The thickness of the polysilicon layer, which is also not critical to the present invention, is typically of from about 500 to about 3000 Å.

The doping of the polysilicon may be performed during the deposition process or after the polysillcon layer has been formed. When doping is carried during the deposition process, the deposition gas includes a gas containing a n- or p-type dopant, i.e. diborane. When doping is carried out after formation of the polysilicon layer, the dopant atoms are introduced by conventional ion implantation. Notwithstanding which of these techniques is employed, the doped polysilicon layer contains a dopant concentration of from about $1 \times 10^{14}$ to about $1 \times 10^{21}$ atoms/cm$^2$.

After deposition and doping, the polysilicon resistor structure is annealed at temperatures which are sufficient to homogenize the distribution of dopant atoms throughout the entire polysilicon layer, raise the concentration of dopant atoms in the silicon grains to at or near the solubility limit, and to recrystallize the silicon film causing the formation of grain boundaries in the polysilicon layer. This annealing step is carried out using conventional furnace anneals or rapid thermal annealing (RTA). Both of these annealing techniques are well known to those skilled in the art. Typically, this annealing step is carried out in an inert gas atmosphere, e.g. He, Ar and N$_2$, that may be mixed with less than about 10% oxygen. It is also possible to use an oxidizing ambient in place of an inert gas atmosphere during the annealing of the polysilicon resistor.

The exact temperatures and times of annealing vary depending on the annealing technique used as well as the type of dopant found in the polysilicon layer. For example, when a furnace anneal is employed and B is used as the dopant species, annealing is carried out at a temperature of about 900° C. for a time period of about 20 minutes. For the same dopant species, RTA is carried out at about 950° C. for about 7 seconds. On the other hand, when As is the dopant species, the furnace anneal is carried out at about 750° C. for about 20 minutes. It is noted that the second anneal of the present invention can follow this annealing step or it can occur later during any other high temperature device activation anneal.

The polysilicon resistor structure may be patterned using standard lithography and etching such as reactive ion etching (RIE) and then the structure can be used in the fabrication of various integrated circuits. Examples of integrated circuits that can be fabricated from the polysilicon resistor structure include: CMOS, BiCMOS and other integration schemes. It is noted that each of these integrated circuits comprise at least one active device region which is formed in and/or on the polysilicon resistor structure. The fabrication of the various integrated circuits having active device regions in and/or on the structure is carried out by using techniques well known to those skilled in the art. Since such fabrication techniques are well known, a description of the various fabrication steps is not needed herein.

It is, however, emphasized that the second annealing step mentioned above occurs after a high temperature device activation anneal which is used in making the devices of the integrated circuit. For example, the second anneal step may occur after high temperature anneals that are capable of activating source/drain diffusion regions which are formed in the semiconductor substrate, activating the emitter region of a bipolar emitter, or forming a silicide or dielectric layer. Common to all these is that a high temperature anneal step is required to activate the device regions of the integrated circuit. The term "high temperature" is used herein to denote a temperature of about 800° C. or above. It is again noted that the lower temperature range may vary as much as ±20° C. depending on dopant species and polysilicon composition. The length of such high temperature RTA's varies depending on the desired goal, but generally the length of the high temperature anneals is from about 3 to about 120 seconds, with a time period of from about 5 to about 60 seconds being more highly preferred. When a furnace anneal is employed, the high temperature device activation anneals are carried out at a temperature that is about 75° C. less than those employed in the RTA. The time for high temperature device furnace anneals is from about 5 to about 60 min. The high temperature anneals (RTA or furnace) are carried out in an inert gas atmosphere that may be, optionally, mixed with less than 10% oxygen. It is also within the contemplation of the present invention to use an oxygen ambient having an oxygen content of greater than 10% as an annealing ambient. Other gases such as $N_2O_2$ or $NH_3$, may also be employed.

After one of the above high temperature device activation anneals is performed, applicants have determined that by applying a second anneal it is possible to control the tolerance of the resistor so that it is not as susceptible to low temperature variations which are typically used in conventional BEOL or FEOL processing. Moreover, applicants have found that by controlling the temperature of the second anneal, a polysilicon resistor which has a higher or lower resistance than that which can be normally produced can be formed.

In one embodiment of the present invention, the second anneal is carried out at temperature lower than about 800° C. Specifically, in this embodiment, the second anneal is carried out at a temperature which is capable of deactivating the dopant atoms in the polysilicon layer. This results in increasing the resistor's resistance. When the low temperature second anneal embodiment of the present invention is employed, the second annealing step preferably occurs at a temperature of from about 625° to about 750° C. for a time period of at least about 30 seconds or greater.

In the second embodiment of the present invention, the second anneal is carried out at a temperature greater than about 800° C. Specifically, in this embodiment, the second anneal is conducted at a temperature that is capable of activating the dopant atoms within the polysilicon layer. This embodiment of the present invention lowers the resistance of the polysilicon resistor. When the second anneal is carried out at temperatures higher than about 800° C., the second anneal is preferably conducted at a temperature of from about 810° to about 890° C. for a time period of from about 1 to about 10 seconds.

It is emphasized that the second anneal occurs immediately after the high temperature device activation anneal. Moreover, the second anneal is carried out in the same gas atmosphere as the high temperature device activation anneal. It is also within the contemplation of the present invention to add the second anneal to two -or more high temperature device activation anneals. For example, it is possible to use the second anneal after source/drain activation and after silicide conversion.

As stated above, the method of the present invention allows for fabricating an integrated circuit in which the polysilicon resistor is not susceptible to low temperature resistance variation caused by BEOL and FEOL processing. Moreover, the method of the present invention allows for a means for tuning the polysilicon resistor to a predetermined value by adjusting the temperature used in the second anneal.

While the present invention has been described and shown with respect to preferred embodiments thereof, it will be understood by those skilled in the art that the foregoing and other changes in form and detail may be made without departing from the spirit and scope of the present application. It is therefore intended that the present application not be limited to the exact forms described and illustrated, but fall within the scope of the appended claims.

Having thus described our invention in detail, what we claim as new and desire to secure by the Letters Patent is:

1. A method of controlling the resistance and tolerance of a polysilicon resistor, said method comprising the steps of:
   (a) providing a polysilicon resistor structure, said polysilicon resistor structure including at least a semiconductor substrate, a dielectric formed on said semiconductor substrate, and a doped polysilicon layer formed on said dielectric layer;
   (b) forming device regions in and/or on the structure provided in (a);
   (c) conducting a high temperature device activation anneal on said structure provided in (b), said high temperature device activation anneal is carried out at a temperature of about 800° C. or above so as to provide active device regions in and/or on said structure; and
   (d) conducting a second annealing step, after said high temperature anneal, at a temperature less than about 800° C. so as to cause an increase in resistance of said polysilicon resistor.

2. The method of claim 1 wherein step (d) is replaced by (d') conducting a second annealing step, after said high temperature device activation anneal, at a temperature higher than about 800° C. so as to cause a decrease in resistance of said polysilicon resistor.

3. The method of claim 1 wherein said semiconductor substrate is composed of Si, Ge, SiGe, SiCGe, Ga, GaAs, InAs, InP or another III/V compound.

4. The method of claim 3 wherein said semiconductor substrate is composed of Si.

5. The method of claim 1 wherein said dielectric layer is composed of $SiO_2$, $Si_3N_4$, diamond, diamond-like carbon, perovskite-type oxides, polyimides, silicon-containing polymers, paralene polymers or other inorganic or organic dielectrics.

6. The method of claim 5 wherein said dielectric layer is composed of $SiO_2$ or $Si_3N_4$.

7. The method of claim 1 wherein said high temperature device activation anneal is carried out in an inert gas atmosphere selected from the group consisting of He, Ar and $N_2$.

8. The method of claim 7 wherein said inert gas atmosphere further comprises oxygen in an amount of 10% or less.

9. The method of claim 1 wherein said high temperature device activation step is carried out using a RTA process or a furnace process.

10. The method of claim 1 wherein the temperature of said high temperature device activation step is dependent on the dopant species and the polysilicon composition.

11. The method of claim 1 wherein said high temperature device activation anneal is capable of activating a source/drain region, activating a bipolar emitter region or forming a silicide or dielectric layer.

12. The method of claim 1 wherein said second anneal is carried out in an inert gas atmosphere at a temperature of from about 625° to about 750° C. for a time period of at least about 30 seconds.

13. The method of claim 2 wherein said second anneal is carried out in an inert gas atmosphere at a temperature of from about 810° to about 890° C. for a time period of from about 1 to about 10 seconds.

14. The method of claim 1 wherein a conductive material is applied to the polysilicon layer.

15. The method of claim 14 wherein said conductive material is composed of Ti, W, Ta or Co.

16. The method of claim 2 wherein a conductive material is applied to the polysilicon layer.

17. The method of claim 16 wherein said conductive material is composed of Ti, W, Ta or Co.

* * * * *